United States Patent [19]
Maitre

[11] Patent Number: 4,719,435
[45] Date of Patent: Jan. 12, 1988

[54] RESONANT MICROSTRIP-LINE CIRCUIT

[75] Inventor: Thierry Maitre, Rueil Malmaison, France

[73] Assignee: U.S. Philips Corporation, New York, N.Y.

[21] Appl. No.: 859,300

[22] Filed: May 5, 1986

[30] Foreign Application Priority Data

Nov. 5, 1985 [FR] France ................................ 85 16378

[51] Int. Cl.$^4$ .......................... H01P 7/08; H01P 1/203
[52] U.S. Cl. ...................................... 333/224; 333/205; 333/246; 333/247; 333/263
[58] Field of Search ............................ 333/222–226, 333/235, 246, 247, 219, 202, 204, 205, 206, 207, 263; 331/96, 99, 101, 117 D

[56] References Cited

U.S. PATENT DOCUMENTS

| | | | |
|---|---|---|---|
| 3,359,513 | 12/1967 | Kelley | 333/246 X |
| 3,613,035 | 10/1971 | Askew | 333/246 |
| 3,925,740 | 12/1975 | Steensma | 333/226 X |
| 4,578,656 | 3/1986 | La Cour et al. | 333/204 |

FOREIGN PATENT DOCUMENTS 0044941 3/1982 European Pat. Off. .
2027299 2/1980 United Kingdom .

OTHER PUBLICATIONS (Abstract) Japanese Patent Document 56-6502, Imai, Jan. 23, 1981; 1 page.

Primary Examiner—Marvin L. Nussbaum
Attorney, Agent, or Firm—Robert J. Kraus

[57] ABSTRACT

The invention relates to a device for the fine adjustment of a resonant microstrip-line formed on an insulating substrate (2), tuned by a varicap diode (7,8) which makes it possible to adjust the shape of the curve representing the tuning frequency of the strip line as a function of the direct voltage controlling the diode. One or more blind holes are provided in the surface of the substrate opposite the strip line, and a base part (15) with one or more threaded holes, into which cylinders are screwed, is fitted under the strip line. The cylinders are placed facing the blind holes and are aligned with the holes to enable entry into them. The cylinders and the base part are electrically conductive and connected to ground.

7 Claims, 2 Drawing Figures

RESONANT MICROSTRIP-LINE CIRCUIT

BACKGROUND OF THE INVENTION

The invention relates to a microstrip-line circuit disposed on one face of an insulating substrate, the other face of which carries a ground plane, the strip line being used as a resonant element whose tuning frequency may be modified. A mechanical adjustment device is provided which has at least one moving part which includes at least one electrically conductive part.

A strip line of this kind is used chiefly as an oscillator-tuning element for frequencies an the order of a gigahertz or over, in systems for the reception of satellite television signals. In these systems there is an element located downstream from the aerial lead-in cable, in which is led a signal whose frequency is between 950 MHz and 1.75 GHz. This element is provided with input circuits tuned to a high frequency, followed by a frequency-mixer stage comprising a local oscillator, and delivering an intermediate frequency signal.

When this element is being tuned, the tuning frequency of the input circuits and that of the local oscillator are varied simultaneously. During this operation it is difficult to obtain a frequency variation which is identical for the input circuit and for the local oscillator.

The known solutions used for tuned circuits formed on the basis of variable capacitors and/or wire-wound inductors are not applicable in the present case, for the frequencies in question, since a resonant element consisting of a microstrip line is used, in association with variable-capacity diodes. The manufacturing spreads of these diodes are such that the frequency variation obtained for a given variation of the voltage across the diode is not sufficiently reproducible to make it possible to ensure that the frequency of the oscillator and that of the high-frequency tuning circuit follow each other with a constant difference when the frequency is varied. It is therefore necessary to provide an additional fine adjustment.

A solution for tuning a resonant strip line is described, for example, in the publication, "IEEE Transactions on Microwave Theory and Techniques", Vol. MTT 17, no. 12 (December 1969), pp. 1069–1071. It consists of varying the tuning frequency by altering the position of short-circuits formed by screws passing through the substrate towards the ground and utilising adjustable capacitive elements consisting of gold-plated steel plates which can be moved along the line and are held in position by magnets placed under the substrate. Changing the position of short-circuits from one hole to another produces a variation in steps without intermediate settings, which makes it possible to obtain fine adjustment, and the movable plates held in position by magnets form a possible solution for experimental use as described in the document referred to above, but would be difficult to put into operation in an equipment subject to shocks and vibrations, which might perhaps displace the plates. A mechanical system permitting the longitudinal movement of the plates along the line while ensuring their electrical contact with the line and their solid attachment would be difficult and costly to achieve. Additionally, it is not just a matter of adjusting a strip line for a given frequency but of obtaining a particular frequency-variation curve when a tuning element is varied, particularly the control voltage of a varicap diode located at the end of the line. It is not obvious that the movement of capacitances formed by plates according to the document referred to can resolve this problem.

SUMMARY OF THE INVENTION

It is an object of the invention to provide a strip line in which the tuning frequency can be modified electrically by means of a variable component, particularly a variable-capacitance diode, and in which the shape of the curve representing the variation of the frequency as a function of the control parameter (the direct control voltage in the case of a variable-capacitance diode) can be adjusted finely. This adjustment of the shape of the curve must be obtainable with a number of small adjustment stages and be fine, reproducible and stable.

To achieve this object the microstrip-line circuit according to the invention is characterized in that the ground plane includes at least one interruption located under the strip line, the electrically conductive part being connected to ground and being located opposite the interruption and mechanical means being provided for the fine adjustment of the distance between the strip line and the electrically conductive part.

The adjustment device according to the invention has the advantage of being inexpensive, non-microphonic, free from crackle when the distance is adjusted, operable with a non-insulated metallic tool and insensitive to temperature variations.

In a preferred embodiment the insulating substrate comprises a blind hole provided in the face opposite to that which carries the strip line, the electrically conductive part being adapted to enter this blind hole.

This arrangement makes it possible to obtain a more extensive adjustment range.

A further advantageous embodiment is characterized in that the moving part is a threaded cylindrical part inserted in a threaded bush, both being conductors of electricity, at least at the surface, the bush being fitted on the ground plane. Thus the device comprises no moving element other than the above-mentioned moving part.

To increase the adjustment possibilities at various points on the frequency-variation curve, a still further embodiment is characterized in that the mechanical device comprises several independent moving parts arranged along the length of the strip line. These parts may all be fitted in a common base provided with several threaded holes.

BRIEF DESCRIPTION OF THE DRAWING

The invention will now be explained in detail with reference to the attached drawing figures describing non-limitative examples.

In the Drawing.

DESCRIPTION OF THE PREFERRED EMBODIMENT

To produce a resonant circuit for frequencies on the order of two gigahertz it is preferable to use a microstrip line one of whose extremities is short-circuited or in an open circuit, formed on a double-sided printed-circuit board, carrying a ground plane on one side and the strip line on the other.

An oscillator fitted with such a resonant circuit and whose frequency has to be adjustable, e.g. between 1.43 and 2.23 gigahertz, comprises either a quarter-wave line "shortened" by a variable capacitor or a half-wave line shortened at each extremity by a variable capacitor. The variable capacitors are formed by variable-capacitance diodes.

This oscillator is intended to generate an intermediate frequency of 480 MHz from a received wave whose frequency is between 950 MHz and 1.75 GHz, and to that end the system is provided with a high-frequency preselection stage which is also tuned.

Figure 1:
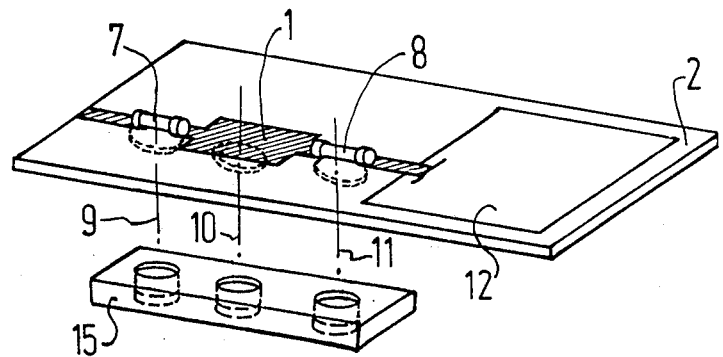
FIG. 1 is a simplified perspective view of a microstrip-line circuit.

FIG. 1 may represent both such stage and an oscilltor stage. Reference numeral 1 indicates a microstrip-line, "shortened" by variable-capacitance diodes 7 and 8, and fitted to a printed-circuit board 2. The active part, either an oscillator or an amplifier, is indicated simply by a rectangle 12.

Figure 2:
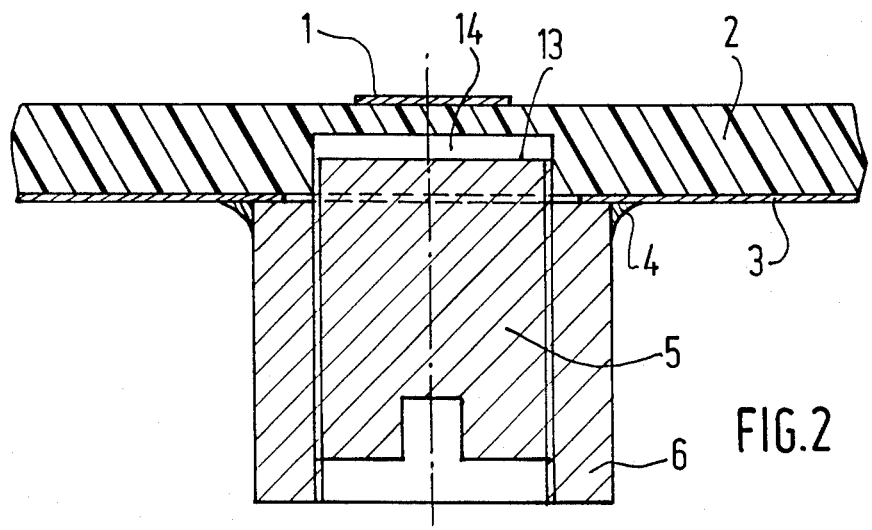
FIG. 2 is a section through the device perpendicular to the axis of the strip line.

The problem to be solved is how to ensure that, when the direct voltage controlling the capacitance of the variable-capacitance diodes 7 and 8 is varied, the tuning frequency of the preselection part on the one hand and that of the oscillator on the other vary jointly while always remaining 480 MHz from one another. To that end one of the two microstrip-line circuits (shown in FIG. 2 in a section perpendicular to the microstrip line 1) is provided with a mechanical adjusting device 4, 5, 6, comprising at least one moving part 5 including at least one electrically conductive part 13, and the ground plane 3 includes an interruption located under the strip line, opposite which the electrically conductive part 13 is located. Mechanical adjusting means 5 and 6 permit the fine adjustment of the distance between the strip line and the conductive part 13. These means consist of a threaded bush 6 inside which a threaded cylindrical part 5 can be turned. The bush 6 and the part 5 are both conductors of electricity, at least at the surface, and the bush is fitted to the ground plane 3 in such a way that the upper section of the cylindrical part 5, which section is plane and parallel to the ground plane 3, and hence also to the strip line 1, and which constituted the above-mentioned conductive part 13, is electrically connected to ground. The two parts 5 and 6 may, for example, be made by machining from solid brass. The bush 6 is fixed to the ground plane 3 by a collar 4 of soft solder. These parts may also be made by moulding in plastic and metallizing; they will then have to be fixed in position by means of, for example, resilient hooks that pass through the substrate 2. This very inexpensive solution, however, if of indifferent quality.

The insulating substrate 2 incorporates a blind hole 14 provided in the face opposite that which carries the strip line 1, and the part 13 can enter this hole. Thus it is possible to obtain a variation of adjustment in both directions, in relation to the frequency which would be obtained if the ground plane were present at this spot.

The theoretical analysis of the effects produced by this type of adjustment is relatively complex and an explanation of it is not indispensable for the understanding of the invention; however, the results of that analysis are interesting. The analysis is based on the fact that the adjustment only operates on the capacitance of the strip line, and locally at that. It thus modifies, in a part of the line, the characteristic impedance and the propagation constant. The results of this analysis are the following: the strip line, being used as a resonator, is not terminated with its characteristic impedance and the standing-wave ratio is intentionally high. Hence:

At a given frequency, when the device is placed in a voltage antimode of the resonator, turning part 5 in more deeply increases the resonator's electrical length and consequently reduces the value of its resonant frequency.

At a given frequency, when the device is placed in the vicinity of a voltage node of the resonator, its effect is more complex:

If, in the vicinity of this voltage node, the line of the resonator shows a capacitive behaviour, turning part 5 in more deeply reduces its electrical length and consequently increases the value of its resonant frequency.

If, in the vicinity of this voltage node, the strip line of the resonator shows an inductive behaviour, turning part 5 in more deeply increases its electrical length and consequently reduces the value of its resonant frequency.

The result of these properties is that the action of the device is different, depending on the frequency. Thus, with a strip line which presents a voltage node at its centre for the middle of the frequency range, a part 5 located at the centre of the line acts in one direction at one extremity of the frequency range and in the other direction at the other extremity of that range. It is thus possible to make the frequency curve "swing" en block round its middle. To obtain even greater precision in the matching of the curve of the high-frequency selector and that of the oscillator, it is of advantage to arrange several independent moving parts along the length of the strip line. Thus, each of these parts will have a different effect, and overall adjustment will be rendered easier. This is preferably done using a wobbulator covering the entire frequency curve. As each moving part acts in a relatively selective manner for a part of the response curve, adjustment of the whole of the curve is obtained rapidly, without having to trim each part 5 a large number of times.

The plurality of moving parts 5 can, to advantage, be arranged in a single common base, containing several threaded holes. FIG. 1 shows a common base 15 of this kind, containing several holes with the respective axes 9, 10 and 11. This base 15 is shown below substrate 2, for the clearness of the figure, but it will be obvious that it must be fitted against the ground plane underneath substrate 2.

At each extremity of the strip line there is a component, namely variable-capacitance diodes 7 and 8, and the axes 9 and 11 pass, for practical purposes, through the centres of the housings of the diodes 7 and 8, respectively. The corresponding moving parts are therefore placed under the diodes.

What is claimed is:

1. An adjustable-frequency resonant device comprising:
   (a) a dielectric substrate having first and second opposing sides;
   (b) a strip transmission line disposed on the first side of the dielectric substrate;
   (c) at least one electrically-controlled, variable-capacity diode disposed on the first side of the dielectric substrate and electrically connected to the strip transmission line;
   (d) a conductive ground plane on the second side of the dielectric substrate having respective openings therein aligned with the strip transmission line and the diode, said dielectric having corresponding holes in the second side communicating with said openings; and (e) mechanical adjusting means for providing local adjustments of the reactance of the strip transmission line and the at least one diode, said mechanical adjusting means being disposed adjacent to the conductive ground plane and including a plurality of moveable elements each having a conductive surface which is moveable through a respective one of the openings in the ground plane and into the corresponding hole, said conductive surface being moveable between positions on opposite sides of the ground plane and being electrically connected to ground, said local adjustments enabling establishment of a predefined frequency response of the resonant device as a function of a control signal applied to the at least one diode.

2. A resonant device as in claim 1 where the conductive surface of at least one of the moveable elements lies in a plane parallel to the conductive ground plane.

3. A resonant device as in claim 1 where at least one of the moveable elements comprises a solid metallic element.

4. A resonant device as in claim 1 where at least one of the moveable element comprises a metallized plastic element.

5. A resonant device as in claim 1 where the mechanical adjusting means comprises at least one threaded bush, at least one of said moveable elements comprising a threaded cylindrical member inserted in said bush and engaging the threads thereof, at least an outer surface of the bush consisting essentially of a conductive material which is electrically connected to the ground plane.

6. A resonant device as in claim 1 where the mechanical adjusting means comprises a common base including a plurality of threaded holes in which respective moveable elements having engaging threads are mounted.

7. A resonant device as in claim 1 where the strip transmission line comprises a segment having first and second ends, each of said ends being connected to a respective one of said voltage-controlled, variable-capacity diodes.

* * * * *